(12) United States Patent
Yang (10) Patent No.: US 11,828,797 B1
(45) Date of Patent: Nov. 28, 2023

(54) PROBING DEVICE (71) Applicant: NANYA TECHNOLOGY CORPORATION, New Taipei (TW)

(72) Inventor: Wu-Der Yang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/738,155

(22) Filed: May 6, 2022

(51) Int. Cl.
G01R 1/02 (2006.01)
G01R 1/04 (2006.01)
G01R 1/067 (2006.01)
G01R 1/073 (2006.01)
G01R 31/26 (2020.01)
G01R 31/28 (2006.01)

(52) U.S. Cl.
CPC ....... G01R 31/2887 (2013.01); G01R 1/0433 (2013.01)

(58) Field of Classification Search
CPC .......... G01R 1/02; G01R 1/04; G01R 1/0433; G01R 1/067; G01R 1/073; G01R 31/02; G01R 31/26; G01R 31/28; G01R 31/2887; G01R 31/2889
See application file for complete search history.

(56) References Cited

U.S. PATENT DOCUMENTS

| | | | |
|---|---|---|---|
| 8,402,848 B2 * | 3/2013 | Kiesewetter | G01R 31/2889 73/866.5 |
| 2004/0064285 A1 | 4/2004 | Repko et al. | |
| 2004/0064288 A1 | 4/2004 | Le et al. | |
| 2018/0122666 A1 * | 5/2018 | Kim | G01R 31/31901 |
| 2020/0400740 A1 | 12/2020 | Fu et al. | |
| 2022/0349937 A1 * | 11/2022 | Reid | G01R 35/005 |

FOREIGN PATENT DOCUMENTS

| | | | | |
|---|---|---|---|---|
| CN | 104622496 | * | 5/2015 | ............... A61B 6/03 |
| CN | 111999634 A | | 11/2020 | |
| CN | 214503706 U | | 10/2021 | |
| TW | 479306 B | | 3/2002 | |
| TW | I692644 B | | 5/2020 | |

OTHER PUBLICATIONS

Office Action dated Apr. 13, 2023 related to Taiwanese Application No. 111129839.

* cited by examiner

Primary Examiner — Neel D Shah
(74) Attorney, Agent, or Firm — Xuan Zhang (57) ABSTRACT

A probing device includes a probe station. The probe station has a platform having an opening and a plurality of column members supporting the platform. Each of the plurality of column members has one end connected with the platform and an opposite end connected with a moving part. The probing device also includes a manipulator on the platform and a socket configured to support a DUT. The manipulator has a probe. The moving part is configured to allow the probe station to be moved with respect to the DUT.

12 Claims, 7 Drawing Sheets

PROBING DEVICE

TECHNICAL FIELD

The present disclosure relates to a probing device, and more particularly, to a probing device including a hollow platform.

DISCUSSION OF THE BACKGROUND

The evolution of semiconductor technology has resulted in an increasing demand for intense memory operations and high-speed semiconductor memory devices, such as dynamic random access memory (DRAM) devices.

A probing device (e.g., a wafer prober) is used to test the electrical characteristics of a device under test (DUT) (e.g., an integrated circuit (IC) device) to check whether the DUT satisfies the product specification. As memory speeds increase, signal attenuation or signal loss becomes a technical bottleneck for probing device.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a probing device. The probing device includes a probe station. The probe station has a platform having an opening and a plurality of column members supporting the platform. Each of the plurality of column members has one end connected with the platform and an opposite end connected with a moving part. The probing device also includes a manipulator on the platform and a socket configured to support a DUT. The manipulator has a probe. The moving part is configured to allow the probe station to be moved with respect to the DUT.

Another aspect of the present disclosure provides a probing device. The probing device includes a probe station. The probe station has a platform with an opening. The probing device also includes a manipulator on the platform. The manipulator has a probe. The probing device also includes a test head and a socket disposed on the test head and configured to support a DUT. The test head has a moving part configured to allow the DUT to be moved with respect to the probe station.

Another aspect of the present disclosure provides an inspection method. The inspection method includes providing a DUT supported by a socket, and disposing the DUT and the socket on a test head. The inspection method also includes providing a probe station having a platform with an opening, and moving the probe station or the test head to position the DUT in the opening.

By providing a probe station having a platform with an opening and a moving part for allowing the DUT to be disposed in the opening, a socket (and the DUT supported thereby) can be disposed on a test head. Therefore, a long cable line (which may be up to about 1.5 meters) between the DUT and the test head is not needed. Issues of signal attenuation or signal loss can be eliminated or reduced. A high speed testing of the DUT can be accomplished. For example, a signal at a frequency greater than about 4267 megahertz (MHz) can be provided to test the electrical properties of the DUT.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only, and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 1A:
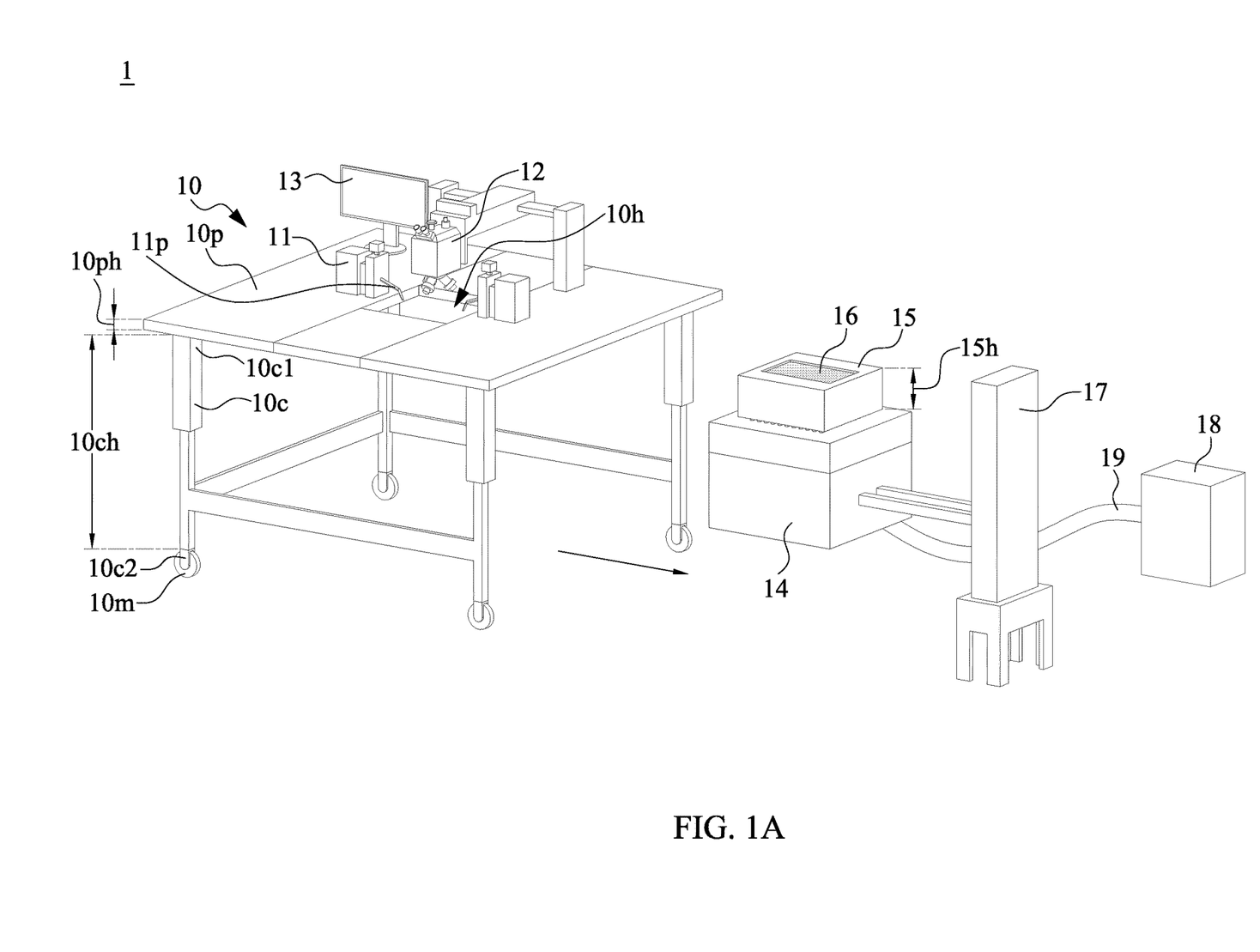
FIG. 1A is a perspective view of a probing device according to some embodiments of the present disclosure.

FIG. 1A is a perspective view of a probing device 1 according to some embodiments of the present disclosure.

The probing device 1 may be used to test the electrical characteristics of the device under test (DUT) to check whether the DUT satisfies the product specification. The probing device 1 may also be referred to as a piece of probing equipment. Examples of the DUT may include, but are not limited to, a whole wafer, a wafer fragment, a semiconductor substrate, a circuit, a memory cell (such as a dynamic random access memory cell (DRAM cell)), a printed circuit board (PCB) mounted with electronic components, etc. The DUT may also include a packaged component, such as a semiconductor package, a ball grid array (BGA) package, a pin grid array (PGA) package, a memory package, etc. The probing device and inspection method of the present disclosure can be applied for any DUT in order to test the electrical characteristics.

Referring to FIG. 1, the probing device 1 may include a probe station 10, a manipulator 11, an observing device 12, a screen 13, a test head 14, a socket 15, a support stand 17, a signal source 18 and a cable 19. A DUT 16 may be supported, accommodated or received by the socket 15.

Although there are ten units or components in the probing device 1, the present disclosure is not limited thereto. For example, in some embodiments, there may be any number of units in the probing device 1. For example, in some embodiments, the probing device 1 may also include (or interact with) other hardware and/or software units not depicted in FIG. 1A, such as a processing unit, a sensing unit, a memory unit, a communication unit, etc.

Figure 1B:
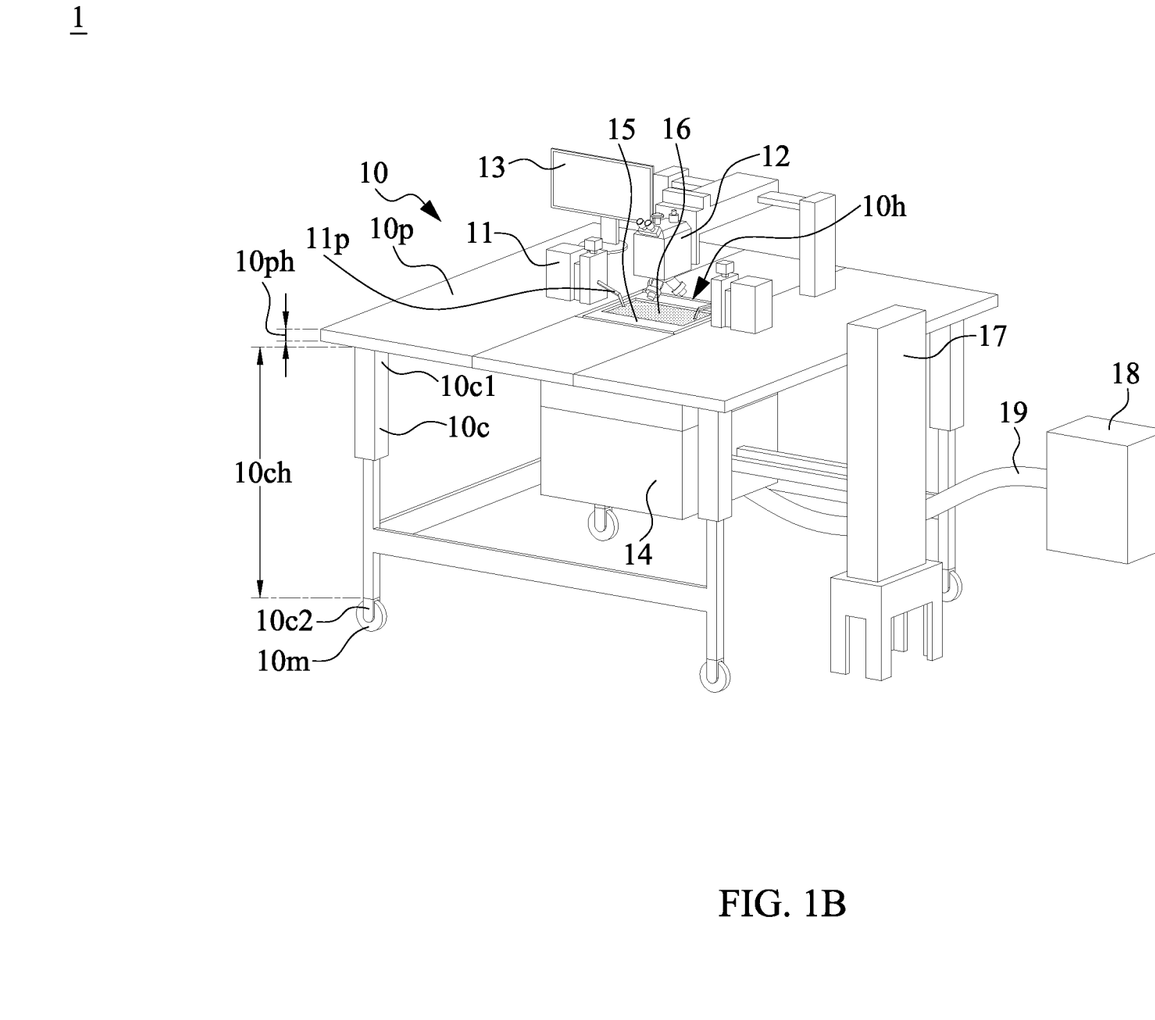
FIG. 1B is a perspective view of a probing device according to some embodiments of the present disclosure.

The probe station 10 may include a platform $10p$ and a plurality of column members (or column shaped members) $10c$ supporting the platform $10p$. The platform $10p$ may have an opening (or a through hole) $10h$. The opening $10h$ may penetrate through the platform $10p$. Therefore, when the test head 14, the socket 15 and the DUT 16 are disposed below the probe station 10 (as shown in FIG. 1B), the DUT 16 can be exposed from the opening $10h$ and observed by the observing device 12.

In some embodiments, the opening $10h$ may be located at a central portion of the platform $10p$. However, in some other embodiments, the opening $10h$ may be proximal to an edge or a side of the platform $10p$ to make room for placing the observing device 12 and the screen 13.

The opening $10h$ may have four sides and four right angles. The opening $10h$ may be rectangular. However, in some other embodiments, the opening $10h$ may include a hexagon, a pentagon, a square, a triangle, a circle, an oval, or any other shapes.

The platform $10p$ may have a thickness $10ph$. The thickness $10ph$ of the platform $10p$ may be consistent or uniform. For example, a thickness of an internal sidewall of the opening $10h$ may be substantially equal to the thickness $10ph$. The platform $10p$ may be thick enough to provide structural support for the manipulator 11, the observing device 12 and the screen 13.

The column members $10c$ may each be adjacent to a corner of the platform $10p$. The column members $10c$ may be spaced apart from each other. There may be four column members $10c$. However, the number and the location of the column members of the probe station are not limited thereto and may be adjusted based on design requirements.

As shown, four column members $10c$ are connected by three beams to increase the structural stability of the probe station 10. For example, the three beams correspond to three sides or edges of the platform $10p$. Two of the column members $10c$ are not connected by a beam to allow the test head 14, the socket 15 and the DUT 16 to pass through and be disposed below the probe station 10.

The column members $10c$ may each have an end $10c1$ connected with the platform $10p$ and an opposite end $10c2$ connected with a moving part $10m$.

The length $10ch$ of each of the column members $10c$ may be adjustable. For example, the column members $10c$ may include expansion or extension columns. For example, the column members $10c$ may include screw drives, sprockets, belts, chains, and/or other objects or mechanisms for raising and lowering the platform $10p$. By adjusting the length $10ch$ of each of the column members $10c$, the distance between the DUT 16 and the platform $10p$ along a z direction (or a z-axis) can be tuned. For example, the platform $10p$ can be moved toward or away from the DUT 16 when the test head 14, the socket 15 and the DUT 16 are disposed below the probe station 10 (as shown in FIG. 1B). The z direction (or a z-axis) may be substantially perpendicular to the ground.

In some embodiments, the column members $10c$ may be connected to, and driven by, a single motor or a single drive mechanism. In this way, only one motor is needed to adjust the length $10ch$, and each column member $10c$ can raise or lower the platform $10p$ simultaneously in equal amounts. Examples of the motor may include a stepping motor, servomotor or the like.

In alternate forms, however, each column member $10c$ may be configured to have its own motor or drive mechanism. Thus, each column member $10c$ may be operable independent of the others. With such a configuration, the column members $10c$ may be used not only to raise and lower the platform $10p$ in the z direction, but also to perform tilt/tip functions to tilt/tip the platform $10p$.

In some embodiments, the motor or drive mechanism of the column members $10c$ may be controlled by the processing unit of the probing device 1 or a processing unit interacting with the probing device 1.

The moving part $10m$ may include a roller, a wheel, or another object or mechanism that enables the movement of the probe station 10. For example, the moving part $10m$ may be configured to allow the probe station 10 to move along x and y directions (or x-axis and y-axis). For example, the moving part $10m$ may be configured to allow the probe station 10 to change the moving direction or rotation, such as to rotate by an angle $\varphi$ in a spherical coordinate system. The x and y directions (or x-axis and y-axis) may each be substantially parallel to the ground.

For example, the moving part $10m$ may be configured to allow the probe station 10 to be moved with respect to the test head 14, the socket 15 and the DUT 16. For example, the moving part $10m$ may be configured to allow the probe station 10 to be easily moved toward and/or away from the test head 14, the socket 15 and the DUT 16.

In some embodiments, the moving part 10m may include a ball joint or a universal joint. For example, the moving part 10m may be universal. In some embodiments, the moving part 10m may include a motor driven wheel. For example, the moving part 10m may be connected to, and driven by, a motor or a drive mechanism.

In some embodiments, the motor or drive mechanism of the moving part 10m may be controlled by the processing unit of the probing device 1 or a processing unit interacting with the probing device 1.

One or more manipulators 11 may be disposed on the platform 10p. The manipulator 11 may be adjacent to the opening 10h. Each of the manipulators 11 may have a probe 11p or a conductive portion in the form of probe. The opening 10h may provide access for the probe 11p to the DUT 16. For example, the probe 11p of the manipulator 11 may extend into the opening 10h to contact the DUT 16.

The manipulator 11 may have or utilize a magnetic mounting base or a vacuum/suction mounting base to attach to the platform 10p. For example, the manipulator 11 may have a mounting base made out of magnetic material which is capable of securing the manipulator 11 to the platform 10p made out of magnetically attractive material, such as metal. However, in some other embodiments, the manipulator 11 may be hard mounted (e.g., bolted) to the platform 10p in order to provide structural stability for precision probing.

The manipulator 11 may be configured to position the probe 11p. For example, the manipulator 11 may be configured to move the probe 11p along x, y and z directions (or x-axis, y-axis and z-axis). In some embodiments, the manipulator 11 may also be configured to adjust the angle (such as the attack angle) between the probe 11p and the DUT 16.

In some embodiments, the manipulator 11 may be connected to, and driven by, a motor or a drive mechanism. In some embodiments, the motor or drive mechanism of the manipulator 11 may be controlled by the processing unit of the probing device 1 or a processing unit interacting with the probing device 1.

In some embodiments, the moving part 10m and the column members 10c may be configured to generally position the DUT 16 in the opening 10h and to position the desired portion of the DUT 16 under the observing device 12. In addition, the manipulator 11 may be configured to actually position the probe 11p on the desired location or test site (e.g., the desired conductive path indicia) of the DUT 16.

In some embodiments, the placement of the probe 11p on the DUT 16 may involve the use of the sensing unit of the probing device 1 or a sensing unit interacting with the probing device 1. The sensing unit may include a variety of motion control mechanisms or feedback mechanisms. For example, a sensing unit may be connected to the column members 10c and the manipulator 11 to track drift along the z-axis over time. The sensing unit may prevent the DUT 16 from being inadvertently damaged by the probe 11p. In some embodiments, the processing unit of the probing device 1 or a processing unit interacting with the probing device 1 may be connected with the sensing unit to stop movement of the column members 10c and/or the manipulator 11 along the z-axis when sufficient probe touchdown has occurred.

Although two manipulators are shown, the probing device 1 can be set up to handle additional manipulators. For example the probing device may be setup using six manipulators or more.

The observing device 12 may be disposed on the platform 10p and allow a user of the probing device 1 to observe the DUT 16 and ensure probe contact with the DUT 16.

In some embodiments, the observing device 12 may include an optical microscope. In some embodiments, the probe station 10 may include a high resolution microscope, such as a scanning electron microscope (SEM), a focused ion beam (FIB) system, or the like. In some embodiments using SEM and/or FIB, the probing device 1 may conduct the inspection method via a non-contact probing process. For example, current path tracing tests, via electron-beam-induced current (EBIC) analysis and optical-beam-induced current (OBIC) analysis, may be conducted.

In some embodiments, the observing device 12 may include a camera configured to capture an image of the DUT 16. In some embodiments, the camera may be configured to capture an image of the DUT 16 during the inspection method of the present disclosure. In some embodiments, the camera may be configured to capture an image of the DUT 16 in situ.

In some embodiments, the camera may include one or more lenses (such as objective lens, zoom lens, relay lens, imaging lens, condensing lens, etc.), one or more light sources (such as a low-power light source, an external light source, a near-infrared light source, etc.), a charge-coupled device (CCD), a complementary metal-oxide semiconductor (CMOS) imaging sensor, or one or more signal converters (such as an analog-to-digital (A/D) converter). In some embodiments, the camera may be omitted.

In some embodiments, the images may be transmitted or updated to a memory unit of the probing device 1 or a memory unit interacting with the probing device 1. In some embodiments, the images may be transmitted or updated to the screen 13.

The screen 13 may be disposed on the platform 10p. The screen 13 may include a display, a panel or a monitor. The screen 13 may be configured to show the images from the observing device 12.

In some embodiments, the probing device 1 may be set up with a software for controlling the movement of the probe 11p. The software interface of the software may be shown via the screen 13. The software interface may allow a user of the probing device 1 to manipulate the position of the probe 11p. For example, the software interface may allow a user of the probing device 1 to indicate the desired location or test site on the DUT 16 and to control the movement of the probe 11p. For example, the control and operation of the probe 11p may be made via on-screen manipulation of a cursor.

In some embodiments, computer interface controls or input devices associated with the screen 13 may include, e.g., a keyboard, mouse, joystick, touch sensitive screen, switches or the like.

In some embodiments, moving the cursor may cause a relative position or a relative movement between the probe 11p and the DUT 16. In some embodiments, the software for controlling the movement of the probe 11p may be programed to operate the manipulator 11 to move the probe 11p along x, y and z directions.

The test head 14 may be supported by the support stand 17. The test head 14 may provide an electrical path between the signal source 18 and the DUT 16. For example, the test head 14 may have a connector (not illustrated in the figures) connected with the cable 19 and an interconnection layer (such as the interconnection layer 14i in FIG. 1D) connected with a protruded or exposed end of a contact pin (such as the contact pin 15i in FIG. 1D) of the socket 15.

The socket 15 may be disposed on the test head 14. In some embodiments, the socket 15 may be hard mounted (e.g., bolted) to the test head 14. For example, the socket 15 may be firmly connected to the test head 14.

In some embodiments, a height 15$h$ of the socket 15 may be equal to or greater than the thickness 10$ph$ of the platform 10$p$. In some embodiments, the height 15$h$ of the socket 15 may be adapted to the thickness 10$ph$ of the platform 10$p$; as a result, when the DUT 16 is disposed in the opening 10$h$, a top surface of the DUT 16 is coplanar with the upper surface of the platform 10$p$. Therefore, the probe 11$p$ and/or the DUT 16 can be protected from being damaged.

In some embodiments, the socket 15 may have a contact pin (such as the contact pin 15$i$ in FIG. 1D) electrically connected with the test head 14. In some embodiments, there may be no cable line (such as a long cable line (which may be up to about 1.5 meters), which may be present in conventional equipment. A detailed description will be provided below with respect to FIG. 1D.

The DUT 16 may be supported, accommodated or received by the socket 15. Therefore, the DUT 16 may be disposed on the test head 14.

The support stand 17 may support the test head 14 and keep the test head 14 away from the ground. Therefore, in some embodiments, the connector of test head 14 for connecting the cable 19 may be located on the bottom surface of the test head 14 facing the ground. In some embodiments, the connector of test head 14 for connecting the cable 19 and the DUT 16 may be at least partially overlapped in a direction substantially perpendicular to the ground so as to reduce the electrical path between the signal source 18 and the DUT 16.

The signal source 18 may be electrically coupled to the test head 14 through, for example, the cable 19. Examples of the cable 19 may include a BNC/coaxial cable, a triaxial cable, a conduit cable, a piping connector, etc.

The signal source 18 may be configured to provide a signal (such as an electrical signal) to test the DUT 16. During the inspection method of the present disclosure, a plurality of electrical signals may be generated by the signal source 18 and transmitted to the corresponding terminals of the DUT 16 through the cable 19, the test head 14 (such as the interconnection layer 14$i$ in FIG. 1D) and a contact pin (such as the contact pin 15$i$ in FIG. 1D) of the socket 15.

The processing unit of the probing device 1 or a processing unit interacting with the probing device 1 may be in communication with the motor or drive mechanism of the column members 10$c$, the motor or drive mechanism of the moving part 10$m$ and the motor or drive mechanism of the manipulator 11. The processing unit may control the movement of the column members 10$c$, the movement of the moving part 10$m$ and the movement of the manipulator 11.

In some embodiments, the processing unit may control the movement of the column members 10$c$, the movement of the moving part 10$m$ and the movement of the manipulator 11 independently, individually, or separately. For example, the processing unit may control the movement of the column members 10$c$, the movement of moving part 10$m$ and the movement of manipulator 11 concurrently or consecutively as desired.

The processing unit may be configured to conduct an inspection method or inspection process of the present disclosure. The processing unit may be configured to execute algorithms or computer-executable instructions stored in a memory such as the memory unit of the probing device 1 or another medium. For example, the processing unit may be configured to cause a series of operational steps to be performed on the probing device 1 or other programmable apparatuses to produce a computer implemented process such that the instructions provide processes for implementing the operations specified in the flow charts (described with respect to FIG. 3).

In some embodiments, the processing unit may include (or may be) a processor (e.g., a central processing unit (CPU), a graphic processing unit (GPU), a micro processing unit (MCU), an application specific integrated circuit (ASIC) or the like) or a controller.

The sensing unit of the probing device 1 or a processing unit interacting with the probing device 1 may be in communication with the processing unit. In some embodiments, the sensing unit may also be in communication with the column members 10$c$, the moving part 10$m$ and the manipulator 11.

In some embodiments, the sensing unit may be configured to detect a shift, a tilt, a rotation, or other movements of each of the column members 10$c$, the moving part 10$m$ and the manipulator 11. For example, the sensing unit may be configured to detect the movement of the column members 10$c$ with respect to the DUT 16, the movement of the moving part 10$m$ with respect to the DUT 16 and the movement of the manipulator 11 with respect to the DUT 16.

In some embodiments, the sensing unit may be configured transmit the detecting result to the processing unit through the communication unit. In some embodiments, the processing unit may be configured to receive the detecting result and then adjust the movement of the column members 10$c$, the movement of the moving part 10$m$ and the movement of the manipulator 11 based on the detecting result. For example, the processing unit may be configured to adjust the moving direction, angle, distance of each of the column members 10$c$, the moving part 10$m$ and the manipulator 11.

In some embodiments, the sensing unit may include a rangefinder, a LiDAR, or another motion control mechanism or a feedback mechanism configured to detect information about an environment of the DUT 16 and output the information.

The memory unit of the probing device 1 or a processing unit interacting with the probing device 1 may be configured to store algorithms or computer-executable instructions of the processing unit. The memory unit may also be configured to store data, such as the trajectory of the movement of the column members 10$c$, the movement of moving part 10$m$ and the movement of manipulator 11. The memory unit may also be configured to store the detecting result of the sensing unit.

In some embodiments, the memory unit may include random access memory (RAM), read only memory (ROM), hard drives, as well as removable memory devices, which can include memory sticks, memory cards, flash drives, external hard drives, and so on.

The communication unit of the probing device 1 or a processing unit interacting with the probing device 1 may be configured to send/receive data to/from the probing device 1 via wired or wireless techniques (e.g., Wi-Fi, cellular networks, Bluetooth, or the like). In some embodiments, the communication unit may include a wireless communication transceiver. For example, the communication unit may include a transmitter, a receiver, an antenna, and so on.

The present disclosure may be embodied as a system, method, computer program or any combination thereof. Accordingly, the present disclosure may take the form of an entirely hardware embodiment, an entirely software embodiment (including firmware, resident software, micro-code, etc.) or an embodiment combining software and hardware aspects that may all generally be referred to herein as a "unit," "module" or "system." Furthermore, the present disclosure may take the form of a computer program embodied in any tangible medium of expression having computer usable program code embodied in the medium.

The present disclosure may be described in the general context of algorithms or computer-executable instructions, such as programs, being executed by a computer. Generally, programs include routines, programs, objects, components, data structures, etc., that perform particular tasks or implement particular abstract data types. The present disclosure may also be practiced in distributed computing environments where tasks are performed by remote processing devices that are linked through a communications network. In a distributed computing environment, programs may be located in both local and remote computer storage media including memory storage devices.

FIG. 1B is a perspective view of the probing device 1 according to some embodiments of the present disclosure. As shown, the test head 14, the socket 15 and the DUT 16 are disposed below the probe station 10. The test head 14, the socket 15 and the DUT 16 are disposed below the platform 10p.

In some embodiments, the test head 14, the socket 15 and the DUT 16 may each be physically separated from the platform 10p to eliminate or reduce vibration caused by the test head 14 (such as a fan or a cooling unit of the test head 14).

In some embodiments, the probe station 10 may include one or more stoppers. The stopper may be disposed below the platform 10p and block an edge of the test head 14 and constrain a movement of the test head 14 in the x direction and/or the y direction. In some embodiments, the stopper may prevent the test head 14 from being displaced during operation.

In a comparative embodiment, the socket 15 is disposed on the probe station 10 and a long cable line may be used to electrically connect the socket 15 to the test head 14. As memory speeds increase, signal attenuation or signal loss caused by the long cable line becomes a technical bottleneck for the probing device.

In addition, the long cable line can be easily separated from the socket 15 or the test head 14, which may result in reduced structural stability and structural reliability of the probing device during the transportation and inspection processes.

By providing the probe station 10 having the platform 10p with the opening 10h and the moving part 10m for allowing the DUT 16 to be disposed in the opening 10h, the socket 15 (and the DUT 16 supported thereby) can be disposed on the test head 14. Therefore, a long cable line between the socket 15 (and the DUT 16 supported thereby) and the test head 14 is not needed. Issues of signal attenuation or signal loss can be eliminated or reduced. A high speed testing of the DUT 16 can be accomplished. For example, a signal at a frequency equal to or greater than about 4267 MHz can be provided to test the electrical properties of the DUT 16. For example, a signal at a frequency equal to or greater than about 5600 MHz can be provided to test the electrical properties of the DUT 16.

Figure 1C:
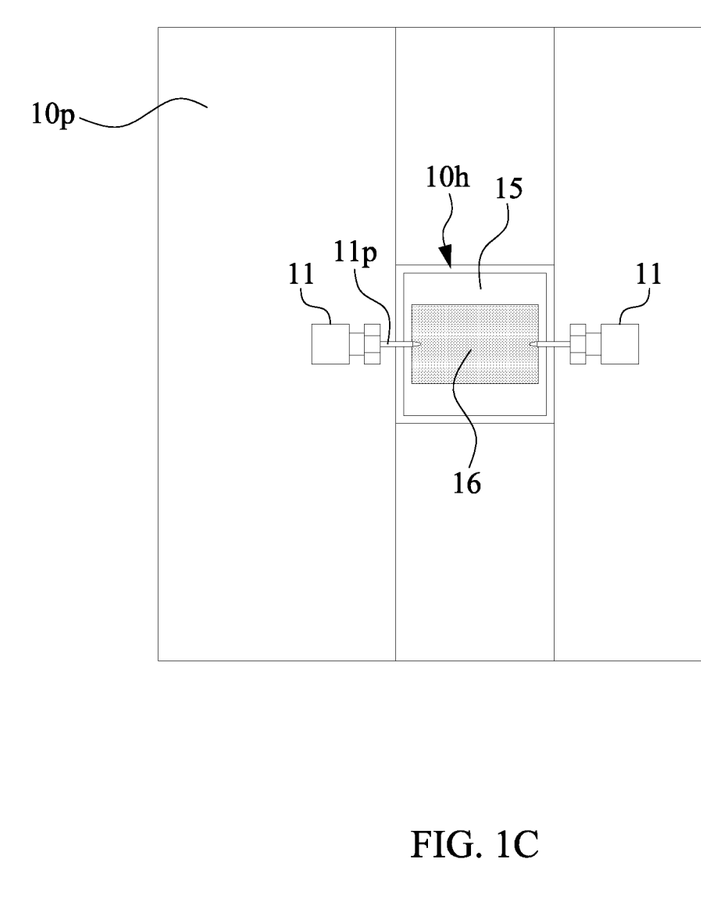
FIG. 1C is a top view of a part of a probing device according to some embodiments of the present disclosure.

FIG. 1C is a top view of a part of the probing device 1 according to some embodiments of the present disclosure.

As shown, when the socket 15 and the DUT 16 are disposed below the platform 10p, the socket 15 and the DUT 16 can be exposed from the opening 10h. For example, at least a part of the top surface of the DUT 16 can be exposed from the opening 10h. For example, the top surface of the DUT 16 can be entirely exposed from the opening 10h. The opening 10h may provide access for the probe 11p to the DUT 16. For example, the probe 11p of the manipulator 11 may extend into the opening 10h to contact the DUT 16.

There may be a gap between the socket 15 and the platform 10p to eliminate or reduce vibration caused by the test head (such as a fan or a cooling unit of the test head 14 shown in FIG. 1A). For example, a gap may surround the socket 15 from a top view.

Figure 1D:
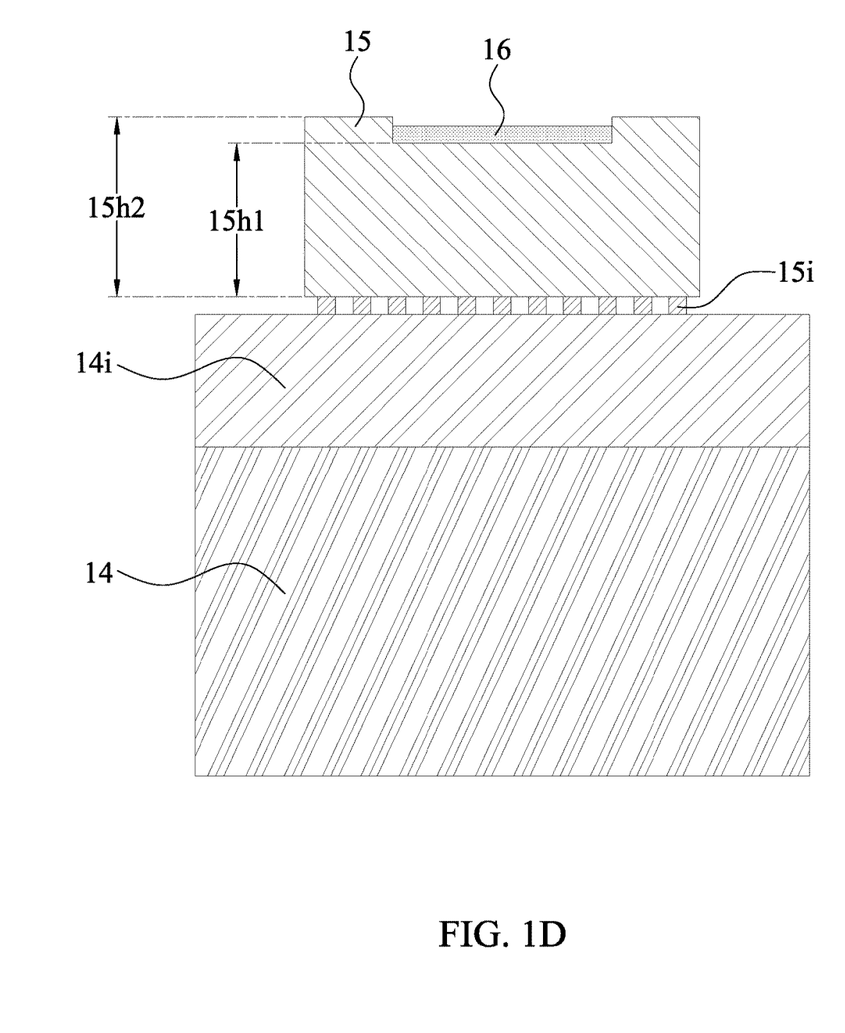
FIG. 1D is a cross-sectional view of a part of a probing device according to some embodiments of the present disclosure.

FIG. 1D is a cross-sectional view of a part of the probing device 1 according to some embodiments of the present disclosure.

In some embodiments, the test head 14 may have the interconnection layer 14i connected with the contact pins 15i of the socket 15.

In some embodiments, the interconnection layer 14i may include an insulating board having interconnection patterns formed therein, such as a PCB. In some embodiments, the interconnection layer 14i may include a plurality of contact pads compatible with the pin configuration of the contact pins 15i. For example, each contact pad may electrically contact with a corresponding contact pin 15i. For example, the distribution of the contact pads of the interconnection layer 14i and the distribution of the contact pins 15i of the socket 15 may be substantially the same.

When the interconnection layer 14i is disposed between the socket 15 and the test head 14, the contact pads of the interconnection layer 14i are also disposed between the socket 15 and the test head 14.

As mentioned, the socket 15 may be disposed on the test head 14. In some embodiments, the socket 15 may be hard mounted (e.g., bolted) to the test head 14. For example, the socket 15 may be firmly connected to the test head 14, and the overall structure shown in FIG. 1D can be strengthened.

The socket 15 may include a base and a frame extending upward along an outer perimeter of an upper surface of the base. The base and the frame may define a recessed portion for receiving the DUT 16. In some embodiments, electrical contacts may be disposed on the base and connected with the contact pins 15i of the socket 15. When the DUT 16 is received in the recessed portion, the electrical contacts disposed on the base may be aligned and in contact with electrical contacts of the DUT 16. The signal source (such as the signal source 18 in FIG. 1A) may be connected to the electrical contacts of the DUT 16 through the connector (not shown in the figure) of the test head 14 for connecting the signal source, the contact pads of the interconnection layer 14i and the contact pins 15i of the socket 15. Therefore, a signal may be provided from the signal source to the DUT 16.

In some embodiments, the socket 15 may include an insulating material, such as polytetrafluoroethylene (PTTE), any other suitable polymer materials, ceramic materials, etc. In some embodiments, the electrical contacts, the contact pads of the interconnection layer 14i and the contact pins 15i of the socket 15 may include conducting materials, such as aluminum, copper, gold, and so on.

In some embodiments, the height of the socket 15 may be the thickness of the base of the socket 15 (such as the height 15h1). However, in some embodiments, the height of the socket 15 may be a distance between the bottom of the base and the topmost surface of the frame (such as the height 15h2).

In some embodiments, the socket 15 may further include one or more fastening members configured to fix the DUT 16 on the base so as to prevent the DUT 16 from separating from the socket 15 during an inspection process.

Figure 2A:
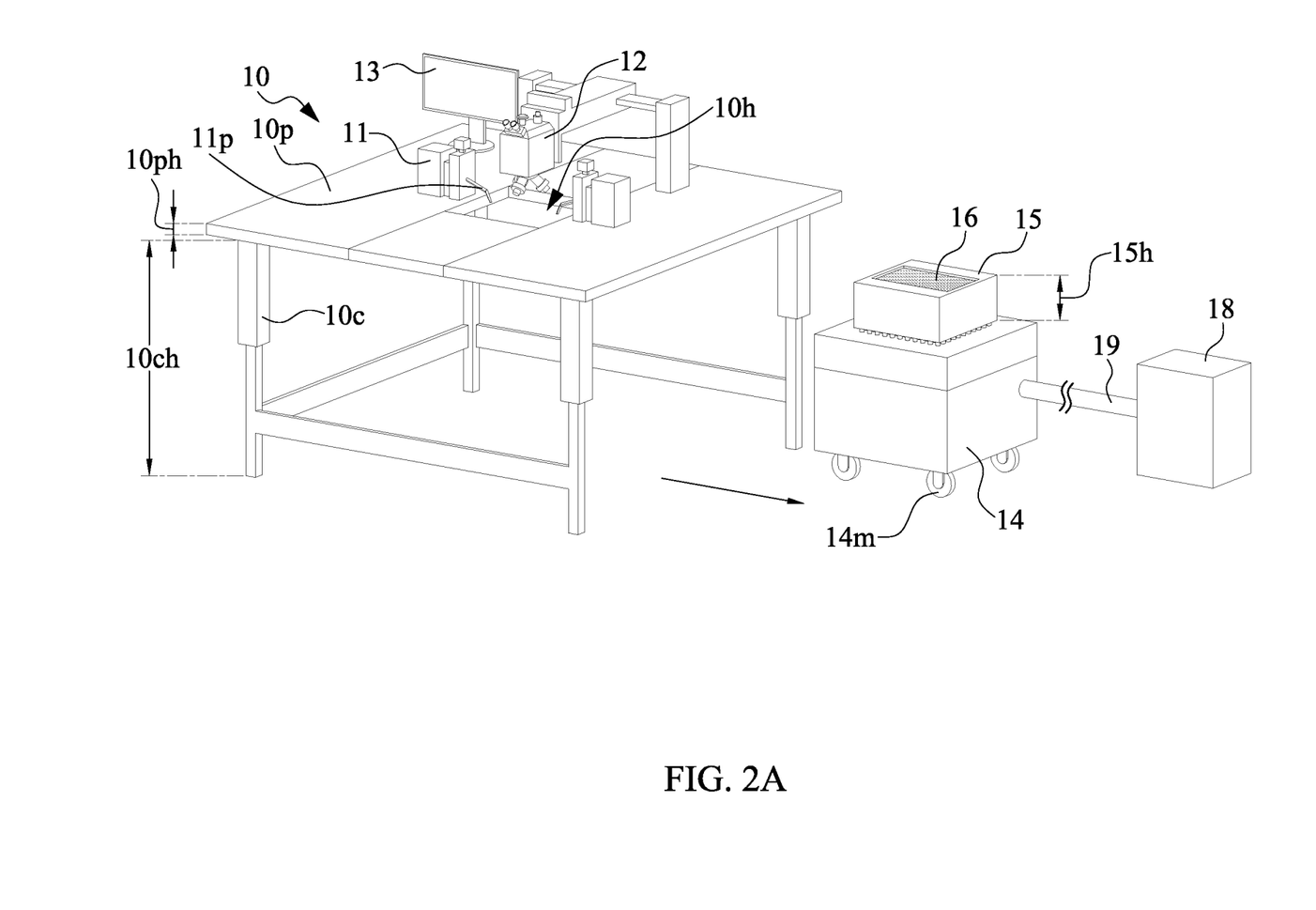
FIG. 2A is a perspective view of a probing device according to some embodiments of the present disclosure.

FIG. 2A is a perspective view of a probing device 2 according to some embodiments of the present disclosure. The probing device 2 of FIG. 2A is similar to the probing device 1 of FIG. 1A, except for the differences described below.

The test head 14 of the probing device 2 may have one or more moving parts 14m.

The moving part 14m may include a roller, a wheel, or another object or mechanism that enables the movement of the test head 14. For example, the moving part 14m may be configured to allow the test head 14 to move along x and y directions (or x-axis and y-axis). For example, the moving part 14m may be configured to allow the test head 14 to change the moving direction or rotation, such as to rotate by an angle φ in a spherical coordinate system.

For example, the moving part 14m may be configured to allow the test head 14, the socket 15 and the DUT 16 to be moved with respect to the probe station 10. For example, the moving part 14m may be configured to allow the test head 14, the socket 15 and the DUT 16 to be easily moved toward and/or away from the probe station 10.

In some embodiments, the moving part 14m may include a ball joint or a universal joint. For example, the moving part 14m may be universal. In some embodiments, the moving part 14m may include a motor driven wheel. For example, the moving part 14m may be connected to, and driven by, a motor or a drive mechanism.

In some embodiments, the motor or drive mechanism of the moving part 14m may be controlled by a processing unit of the probing device 2 or a processing unit interacting with the probing device 2.

The support stand 17 supporting the test head 14 may be omitted. Therefore, the connector (not illustrated in the figures) of the test head 14 for connecting with the cable 19 may be disposed on a lateral surface of the test head 14.

Figure 2B:
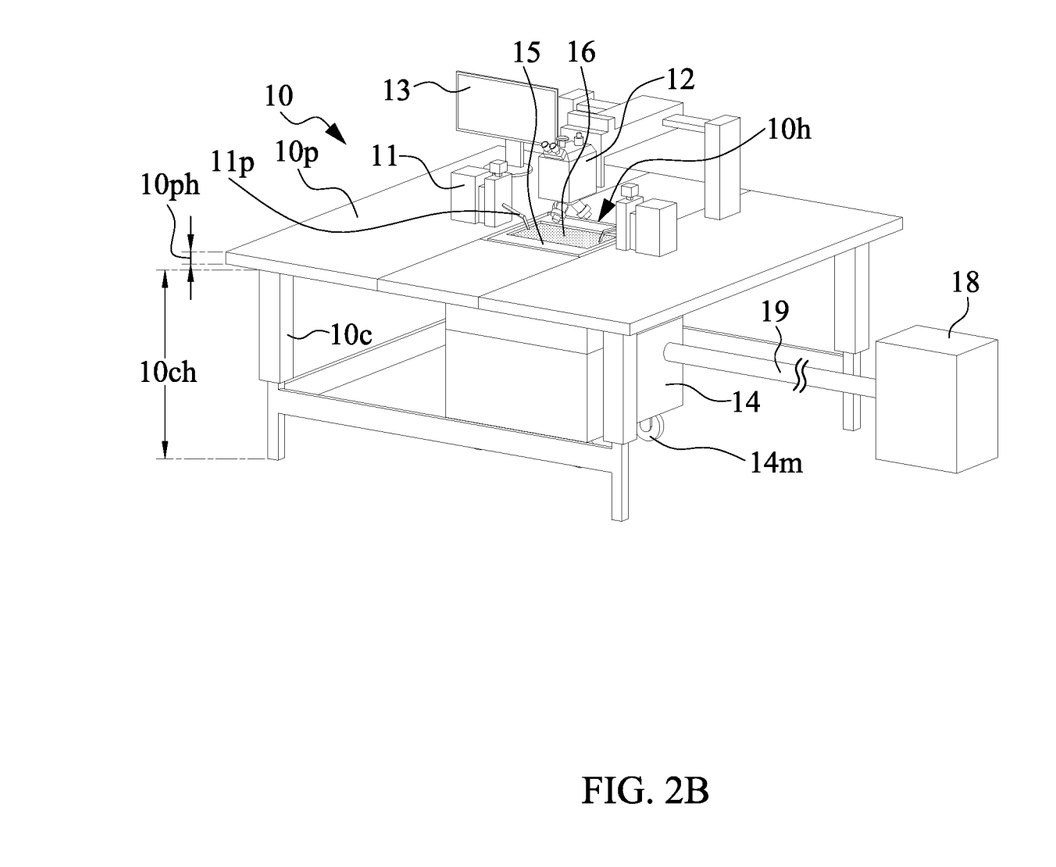
FIG. 2B is a perspective view of a probing device according to some embodiments of the present disclosure.

FIG. 2B is a perspective view of the probing device 2 according to some embodiments of the present disclosure. As shown, the test head 14, the socket 15 and the DUT 16 are disposed below the probe station 10. The test head 14, the socket 15 and the DUT 16 are disposed below the platform 10p.

In some embodiments, the test head 14, the socket 15 and the DUT 16 may each be physically separated from the platform 10p to eliminate or reduce vibration caused by the test head 14 (such as a fan or a cooling unit of the test head 14).

In some embodiments, the probe station 10 may include one or more stoppers. The stopper may be disposed below the platform 10p and block an edge of the test head 14 and constrain a movement of the test head 14 in the x direction and/or the y direction. In some embodiments, the stopper may prevent the test head 14 from being displaced during operation.

Figure 3:
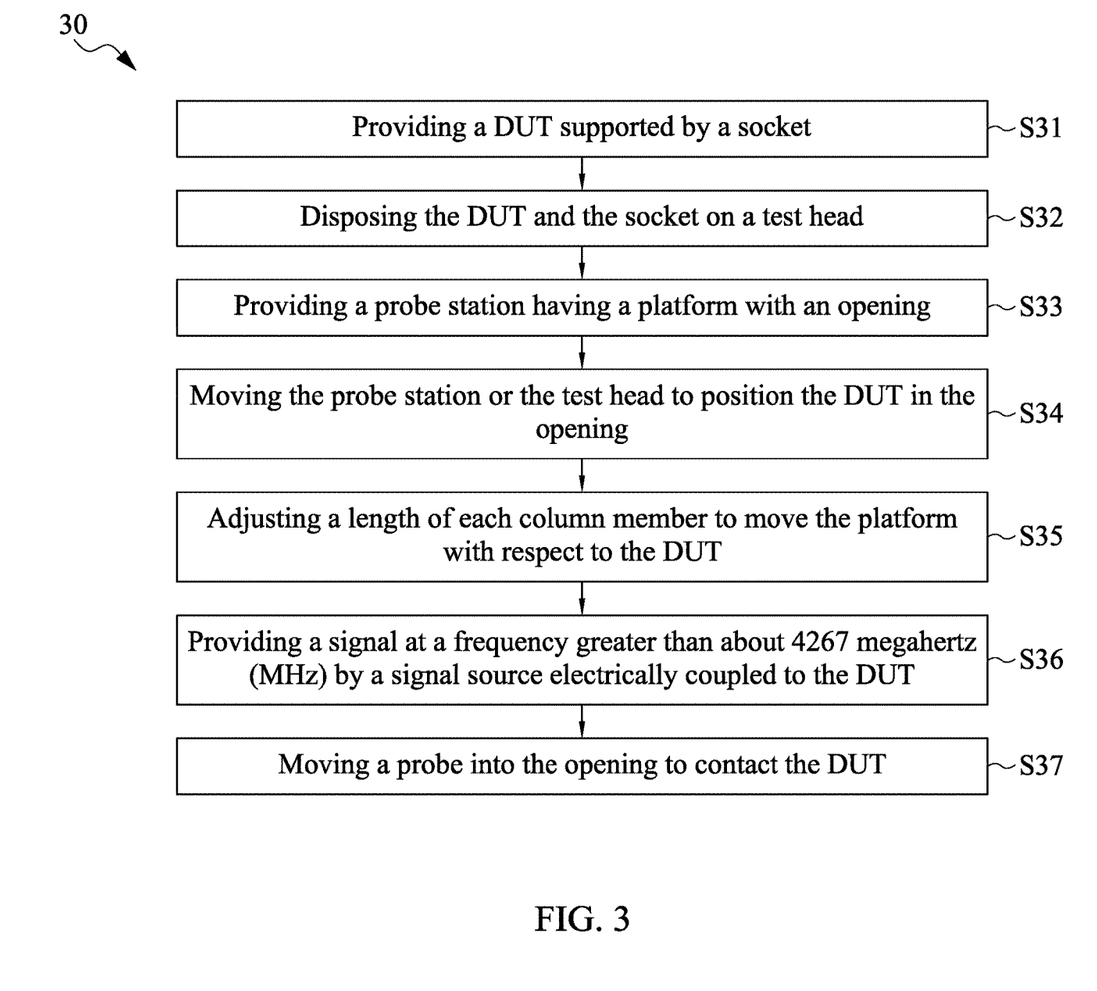
FIG. 3 illustrates a flow chart of an inspection method in accordance with some embodiments of the present disclosure.

FIG. 3 illustrates a flow chart of an inspection method 30 in accordance with some embodiments of the present disclosure.

In some embodiments, the inspection method 30 can be conducted by the processing unit of the probing device 1 or a processing unit interacting with the probing device 1. In some embodiments, the inspection method 30 can be conducted by the processing unit of the probing device 2 or a processing unit interacting with the probing device 2.

The step or operation S31 is providing a DUT supported by a socket. For example, as shown in FIG. 1A and FIG. 1D, the DUT 16 may be supported, accommodated or received by the socket 15.

In some embodiments, the socket 15 may further include one or more fastening members configured to fix the DUT 16 on the base so as to prevent the DUT 16 from separating from the socket 15 during an inspection process.

The step or operation S32 is disposing the DUT and the socket on a test head. For example, as shown in FIG. 1A and FIG. 1D, the DUT 16 and the socket 15 may be disposed on the test head 14.

In some embodiments, the socket 15 may be hard mounted (e.g., bolted) to the test head 14. For example, the socket 15 may be firmly connected to the test head 14, and the overall structure shown in FIG. 1D can be strengthened.

The step or operation S33 is providing a probe station having a platform with an opening. For example, as shown in FIG. 1A, the platform 10p of the probe station 10 may have an opening (or a through hole) 10h. The opening 10h may penetrate through the platform 10p.

In some embodiments, the opening 10h may be located at a central portion of the platform 10p. However, in some other embodiments, the opening 10h may be proximal to an edge or a side of the platform 10p to make room for placing other units (such as the observing device 12 and the screen 13 in FIG. 1A). The opening 10h may have four sides and four right angles. The opening 10h may be rectangular. However, in some other embodiments, the opening 10h may include a hexagon, a pentagon, a square, a triangle, a circle, an oval, or any other shapes.

The step or operation S34 is moving the probe station or the test head to position the DUT in the opening.

For example, as shown in FIG. 1B, the probe station 10 may be moved with respect to the test head 14, the socket 15 and the DUT 16 through the moving part 10m. Therefore, the test head 14, the socket and the DUT 16 may be disposed below the probe station 10. The test head 14, the socket 15 and the DUT 16 may be disposed below the platform 10p. The socket 15 and the DUT 16 may be exposed from the opening 10h. For example, at least a part of the top surface of the DUT 16 can be exposed from the opening 10h. For example, the top surface of the DUT 16 can be entirely exposed from the opening 10h.

For example, as shown in FIG. 2B, the test head 14, the socket and the DUT 16 may be moved with respect to the probe station 10 through the moving part 14m. Therefore, the test head 14, the socket and the DUT 16 may be disposed below the probe station 10. The test head 14, the socket 15 and the DUT 16 may be disposed below the platform 10p. The socket 15 and the DUT 16 may be exposed from the opening 10h. For example, at least a part of the top surface of the DUT 16 can be exposed from the opening 10h. For example, the top surface of the DUT 16 can be entirely exposed from the opening 10h.

In some embodiments, the motor or drive mechanism of the moving part 10m or the moving part 14 may be controlled by the processing unit of the probing device 1 or a processing unit interacting with the probing device 1.

In some embodiments, the probe station 10 may include one or more stoppers. The stopper may be disposed below the platform 10p and block an edge of the test head 14 and constrain a movement of the test head 14 in the x direction and/or the y direction. In some embodiments, the stopper may prevent the test head 14 from being displaced during operation.

The step or operation S35 is adjusting a length of each column member to move the platform with respect to the DUT.

For example, as shown in FIG. 2B, by adjusting the length 10ch of each of the column members 10c, the distance between the DUT 16 and the platform 10p along a z direction (or a z-axis) can be tuned.

In some embodiments, the motor or drive mechanism of the column members 10c may be controlled by the processing unit of the probing device 1 or a processing unit interacting with the probing device 1.

In some embodiments, the moving part 10m and the column members 10c may be configured to generally position the DUT 16 in the opening 10h and to position the desired portion of the DUT 16 under the observing device 12.

The step or operation S36 is providing a signal at a frequency greater than about 4267 MHz by a signal source electrically coupled to the DUT. For example, a signal at a frequency equal to or greater than about 5600 MHz can be provided to test the electrical properties of the DUT 16.

For example, as shown in FIG. 1D, a signal source (such as the signal source 18 in FIG. 1A) may be connected to electrical contacts of the DUT 16 through the connector (not shown in the figure) of the test head 14 for connecting the signal source, the contact pads of the interconnection layer 14i and the contact pins 15i of the socket 15. Therefore, a signal may be provided from the signal source to the DUT 16.

The step or operation S36 is moving a probe into the opening to contact the DUT.

For example, as shown in FIG. 1C, the opening 10h may provide access for the probe 11p to the DUT 16. For example, the probe 11p of the manipulator 11 may extend into the opening 10h to contact the DUT 16.

In some embodiments, the step S36 and the step S37 may be repeated several times in an interval manner. For example, the order and the number of times of the steps may be different from the above order and can be adjusted as desired.

In addition, the manipulator 11 shown in FIG. 1A may be configured to actually position the probe 11p on the desired location or test site (e.g., the desired conductive path indicia) of the DUT 16.

In some embodiments, the placement of the probe 11p on the DUT 16 may involve the use of the sensing unit of the probing device 1 or a sensing unit interacting with the probing device 1. The sensing unit may include a variety of motion control mechanisms or feedback mechanisms. For example, a sensing unit may be connected to the column members 10c and the manipulator 11 to track drift along the z-axis over time. The sensing unit may prevent the DUT 16 from being inadvertently damaged by the probe 11p. In some embodiments, the processing unit of the probing device 1 or a processing unit interacting with the probing device 1 may be connected with the sensing unit to stop movement of the column members 10c and/or the manipulator 11 along the z-axis when sufficient probe touchdown has occurred.

Any reference in the specification to a method should be applied mutatis mutandis to a system capable of executing the method. Any reference in the specification to a system should be applied mutatis mutandis to a method that may be executed by the system.

Although the probing device and the inspection method disclosed herein focus on a probe station capable of being used in a high-speed (or high-frequency) probing test application, the configuration and application of the probing device and the inspection method are not limited thereto. For example, the probing device may be of any configuration (e.g., open-air, vacuum enclosed, etc.) and having any of a variety of features (e.g., thermal components, environmental controls, optical components, microscopes etc.) to conduct electrical and/or reliability test of the DUT.

One aspect of the present disclosure provides a probing device. The probing device includes a probe station. The probe station has a platform having an opening and a plurality of column members supporting the platform. Each of the plurality of column members has one end connected with the platform and an opposite end connected with a moving part. The probing device also includes a manipulator on the platform and a socket configured to support a DUT. The manipulator has a probe. The moving part is configured to allow the probe station to be moved with respect to the DUT.

Another aspect of the present disclosure provides a probing device. The probing device includes a probe station. The probe station has a platform with an opening. The probing device also includes a manipulator on the platform. The manipulator has a probe. The probing device also includes a test head and a socket disposed on the test head and configured to support a DUT. The test head has a moving part configured to allow the DUT to be moved with respect to the probe station.

Another aspect of the present disclosure provides an inspection method. The inspection method includes providing a DUT supported by a socket, and disposing the DUT and the socket on a test head. The inspection method also includes providing a probe station having a platform with an opening, and moving the probe station or the test head to position the DUT in the opening.

By providing a probe station having a platform with an opening and a moving part for allowing the DUT to be disposed in the opening, a socket (and the DUT supported thereby) can be disposed on a test head. Therefore, a long cable line (which may be up to about 1.5 meters) between the DUT and the test head is not needed. Issues of signal attenuation or signal loss can be eliminated or reduced. A high speed testing of the DUT can be accomplished. For example, a signal at a frequency greater than about 4267 MHz can be provided to test the electrical properties of the DUT.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A probing device, comprising:
   a probe station having:
   a platform having an opening; and
   a plurality of column members supporting the platform, wherein each of the plurality of column members has one end connected with the platform and an opposite end connected with a moving part;
   a manipulator on the platform and having a probe; and
   a socket configured to support a device under test (DUT);
   wherein the moving part is configured to allow the probe station to be moved with respect to the DUT, wherein the moving part comprises a motor driven wheel.

2. The probing device of claim 1, wherein a height of the socket is equal to or greater than a thickness of the platform.

3. The probing device of claim 1, wherein a length of each of the plurality of column members is adjustable.

4. The probing device of claim 1, wherein the socket and the DUT are physically separated from the probe station.

5. The probing device of claim 1, wherein the DUT comprises a dynamic random access memory (DRAM) device.

6. The probing device of claim 1, further comprise:
   an observing device disposed on the platform and over the opening; and
   a screen disposed on the platform.

7. The probing device of claim 1, further comprise:
   a signal source electrically coupled to the DUT and configured to provide a signal at a frequency greater than about 4267 megahertz (MHz).

8. The probing device of claim 7, further comprise:
   a test head electrically coupled to the DUT and configured to provide an electrical path between the signal source and the DUT.

9. The probing device of claim 1, wherein the socket and the DUT are disposed on the test head.

10. The probing device of claim 9, wherein the test head is configured to be disposed below the platform.

11. The probing device of claim 1, wherein the DUT is configured to be positioned in the opening.

12. The probing device of claim 1, wherein the manipulator is configured to move the probe into the opening and contact the DUT.

* * * * *